(12) United States Patent
Anthony

(10) Patent No.: US 6,580,144 B2
(45) Date of Patent: Jun. 17, 2003

(54) ONE TIME PROGRAMMABLE FUSE/ANTI-FUSE COMBINATION BASED MEMORY CELL

(75) Inventor: Thomas C. Anthony, Sunnyvale, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 09/964,768

(22) Filed: Sep. 28, 2001

(65) Prior Publication Data

US 2003/0062595 A1 Apr. 3, 2003

(51) Int. Cl.[7] .......................... H01L 29/00; H01L 21/44
(52) U.S. Cl. ...................... 257/529; 257/530; 438/600; 438/601
(58) Field of Search .................. 257/528–530, 257/209; 438/131, 467, 600, 601

(56) References Cited

U.S. PATENT DOCUMENTS

| | | | | |
|---|---|---|---|---|
| 4,914,055 A | * | 4/1990 | Gordon et al. ............... 438/600 |
| 5,011,791 A | * | 4/1991 | Mastroianni ................. 438/601 |
| 5,427,979 A | * | 6/1995 | Chang ......................... 438/600 |
| 5,763,898 A | * | 6/1998 | Forouhi et al. ............... 257/50 |
| 5,903,041 A | * | 5/1999 | La Fleur et al. ............. 257/209 |
| 6,124,194 A | * | 9/2000 | Shao et al. .................. 257/529 |
| 6,242,789 B1 | * | 6/2001 | Weber et al. ................ 257/529 |
| 6,400,008 B1 | * | 6/2002 | Farnworth ................... 257/698 |
| 6,429,503 B2 | * | 8/2002 | Lehr et al. .................. 257/530 |
| 6,433,404 B1 | * | 8/2002 | Iyer et al. ................... 257/529 |
| 6,498,056 B1 | * | 12/2002 | Motsiff et al. .............. 438/131 |
| 6,509,624 B1 | * | 1/2003 | Radens et al. .............. 257/530 |
| 2002/0079553 A1 | * | 6/2002 | Cleeves ...................... 257/530 |
| 2002/0113291 A1 | * | 8/2002 | Adkisson et al. ........... 257/529 |

* cited by examiner

Primary Examiner—Ngân V. Ngô
Assistant Examiner—Thao X. Le

(57) ABSTRACT

A one-time programmable memory cell includes a fuse and an anti-fuse in series. The memory cell has two states, an initial state and a written (programmed) state. In the initial state, a resistance of the cell is finite, typically dominated by the relatively high resistance of the anti-fuse. In the written state, the resistance is infinite because the breakdown of the fuse resulting in an open circuit. The cell may be programmed by applying a critical voltage across the cell generating a critical current to cause the fuse to become open. When critical voltage is applied, this generally causes the anti-fuse to break down, which in turn causes a pulse of high current to be applied to the fuse. The states are detected by applying a read voltage across the memory cell. If the memory has not been programmed, then a measurable amount flows. Otherwise, no current flows.

24 Claims, 17 Drawing Sheets

ONE TIME PROGRAMMABLE FUSE/ANTI-FUSE COMBINATION BASED MEMORY CELL

RELATED APPLICATIONS

The following applications of the common assignee may contain some common disclosure and may relate to the present invention:

U.S. patent application Ser. No. 09/964,770, entitled "VERTICALLY ORIENTED NANO-FUSE AND NANO-RESISTOR CIRCUIT ELEMENTS" (Attorney Docket No. 10012295-1);

U.S. patent application Ser. No. 09/924,500, filed Aug. 9, 2001, entitled "ONE-TIME PROGRAMMABLE VERTICALLY ORIENTED FUSE AND VERTICALLY ORIENTED FUSE/DIODE UNIT MEMORY CELL AND ONE-TIME PROGRAMMABLE MEMORY USING THE SAME" (Attorney Docket No. 10019168-1);

U.S. patent application Ser. No. 09/924,577, filed Aug. 9, 2001, entitled "ONE-TIME PROGRAMMABLE MEMORY USING FUSE/ANTI-FUSE AND VERTICALLY ORIENTED FUSE UNIT MEMORY CELLS" (Attorney Docket No. 10012495-1).

FIELD OF THE INVENTION

This invention relates generally to programmable memory cells. More particularly, the invention relates to a one-time programmable memory cells.

BACKGROUND OF THE INVENTION

The demand for semiconductor devices has increased dramatically in recent years. One can readily observe the pervasiveness of consumer electronic devices in the modern world. Most or all of the consumer electronic devices are made possible because of developments in semiconductor devices. As the consumer electronic devices become smaller, more sophisticated, and less expensive, increasingly higher densities of the semiconductor devices, including memories, are demanded at a lower cost in today's market place.

In the field of memories, the demand for ever increasing densities and lower cost is particularly true, especially for the non-volatile memories, i.e., those memories that do not lose data even when power is not supplied.

A non-volatile memory may be a one time programmable ("OTP") or reprogrammable. As the name suggests, OTP memory is programmed once, and it is permanent for all practical purposes. Most OTP memories can be categorized into four basic types: 1) anti-fuse, 2) fuse, 3) charge storage (EPROM), and 4) mask ROM.

Existing OTP memory technologies described above are based on cell sizes considerably larger than $4\lambda^2$, the minimum cell size for a cross-point memory. In addition, in each case the memory cell consists of a single plane of memory elements constructed on a single crystal silicon substrate, with sense and programming electronics located around the periphery of the memory array. Since single crystal silicon transistors are integral components of the memory elements in the foregoing technologies, stacking memory layers on top of one another to increase density is not possible. Consequently, high density, low cost OTP memories are difficult to fabricate.

SUMMARY OF THE INVENTION

In one respect, an exemplary embodiment of a memory cell may include a top conductor extending in a first direction and a bottom conductor extending in a second direction. The top and bottom conductors define a region of overlap at an intersection between the two conductors. The top and bottom conductors are electrically connected. The memory cell may also include a fuse formed in the region of overlap between the top and bottom conductors. The fuse may also have electrical connectivity with the top and bottom conductors. Further, the memory cell may include an anti-fuse in electrical series with the fuse. The anti-fuse may also be formed between the top and bottom conductors. The fuse may be vertically oriented, i.e. the current substantially flows vertically within the fuse.

In another respect, an exemplary embodiment of a method of fabricating a memory cell may include forming a top conductor extending in a first direction and forming a bottom conductor extending in a second direction so as to define a region of overlap at an intersection between the top and bottom conductors. The top and bottom conductors may have electrical connectivity with each other. The method may also included forming a fuse in the cross-point between the top and bottom conductors. The method may further include forming an anti-fuse in electrical series with the fuse.

The above disclosed exemplary embodiments may be capable of achieving certain aspects. For example, the size of the memory cell may be dramatically reduced. This enables providing a high density OTP memory cell at much lower cost. Also, the memory cell may be fabricated using standard semiconductor processes and materials, and thus, little to no capital investment may be required beyond that present in the current state-of-the-art manufacturing. Further, the current flow in the memory cells is substantially perpendicular (vertical) to the substrate plane. This allows the cells to be inserted between adjacent conductors. In particular, the cells can be placed at an intersection of a cross-point array of conductors to form a cross-point OTP memory array. The cross-point memory arrays can be fabricated such that the planar area of each memory cell is $4\lambda^2$. Planes of these arrays can be stacked on top of one another, which increases the density dramatically.

BRIEF DESCRIPTION OF THE DRAWINGS

Features of the present invention will become apparent to those skilled in the art from the following description with reference to the drawings, in which:

FIGS. 2A-2, 2D-2, 2A-3 and 2D-3 illustrate modifications to the method of fabricating the first embodiment of the memory cell to fabricate the variations shown in FIGS. 1C–D;

DETAILED DESCRIPTION

For simplicity and illustrative purposes, the principles of the present invention are described by referring mainly to exemplary embodiments thereof. However, one of ordinary skill in the art would readily recognize that the same principles are equally applicable to many types of a memory cells and methods of fabrication thereof.

In general, a memory cell, according to certain aspects of the present invention, is located at a region of overlap of two conductors, for example a cross-point. The memory cell generally includes a fuse in series with an anti-fuse. The anti-fuse is an element that has an initial high resistance and changes to a relatively low resistance when a critical voltage or critical current is applied.

Figure 5A:
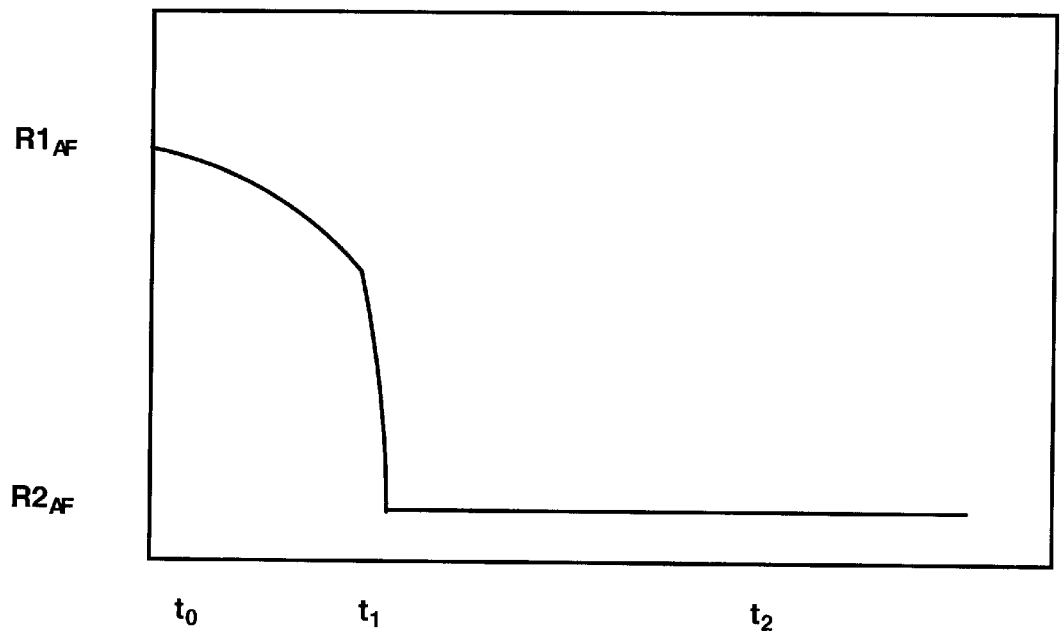
FIG. 5A illustrates a resistance characteristic of an exemplary anti-fuse according to an aspect of the present invention.

FIG. 5A illustrates a resistance characteristic of an exemplary anti-fuse according to an aspect of the present invention. As shown, the anti-fuse has an initial high resistance $R1_{AF}$. When a critical voltage $V_C$ is applied at time $t_0$, current begins to flow through the anti-fuse. At time $t_1$, the anti-fuse breaks down to a relatively low resistance $R2_{AF}$. If voltage $V_C$ continues to be applied, a large current flows through the anti-fuse after time $t_1$.

An anti-fuse can be formed from insulator materials, a multilayer stack of insulator materials separated by conducting materials, a matrix of insulating material containing dispersed conductive inclusions, amorphous and crystalline semiconductor materials, phase change materials, combinations of a multi-layer stack of Si and silicide-forming metals, etc. Generally, the anti-fuse is sandwiched between two conducting materials to enable applications of voltage across the anti-fuse. Insulator materials include diamond like carbon, $SiO_X$, $SiN_X$, $SiO_XN_Y$, $AlO_X$, $TaO_X$, $TiO_X$, $AlN_X$ and the like; amorphous and crystalline semiconductor materials include Si, Ge, alloys of Si and Ge, GaAs, and the like; phase change materials include alloys containing at least two elements selected from Si, Ge, As, Se, In, Sn, Sb, Te, Pb, Bi, and the like; silicide-forming metals include W, Pt, Pd, Co, Ni, Ti, and the like and alloys thereof.

If insulator materials are used as the anti-fuse, then the thickness of the anti-fuse is preferably between 0.5 and 50 nm. However, the thickness may be set to an arbitrary range depending on the circumstances. For instance, if appreciable current flow is desired through the anti-fuse in a pre-breakdown condition, then the insulator thickness may be chosen to be less than about 5 nm so that significant quantum mechanical tunneling current can flow at a modest voltage. If amorphous and crystalline semiconductor materials are used, the thickness is preferably between 1 and 100 nm. Again, the thickness may be varied.

As noted above, the anti-fuse is an element that has an initial high resistance and changes to a relatively low resistance when a critical voltage is applied. The mechanism that achieves the different resistive states is different for different materials. For example, anti-fuses formed from phase change materials have a high resistance when in an amorphous state and a low resistance when in a crystalline state. Also, anti-fuses formed from multilayer Si and silicide-forming metals have a high resistance when the multilayer has not been converted to silicide and a low resistance when said multilayer has been converted to the silicide. In both cases, many orders of magnitude separate the high and low resistance states.

As another example, if an insulator type of anti-fuse is used, up to the critical voltage $V_C$, current passes through the insulating barrier of the metal-insulator-metal structure by electron tunneling, and the specific resistance of the cell can be rather large, for example, in the order of $10^7$ $\Omega$-$\mu m^2$. However, beyond the critical voltage $V_C$, the barrier breaks down due to metal migration through the insulator, and the specific resistance of the cell can drop to below 100 $\Omega$-$\mu m^2$. Similar current transport and breakdown mechanisms are operative in layered insulators and insulators containing conductive inclusions.

Unlike the anti-fuse, the fuse is an element that has an initial low resistance and changes to a high resistance, mostly to an open circuit when a critical current is applied. The fuse may be a thin film resistor, and may be formed from materials such as semiconductors (e.g. Si, Ge), conductors (e.g. Al, Cu, Ag, Au, Pt), low melting temperature materials (e.g. Zn, Sn, Pb, In), refractories (e.g. Ta, W), transition metals (Ni, Cr) and the like and any alloys thereof. It is even more beneficial if the fuse is vertically oriented, i.e. the direction of the current flow is substantially vertical within the fuse, since very small memory elements can be achieved with vertically oriented fuses.

Figure 5B:
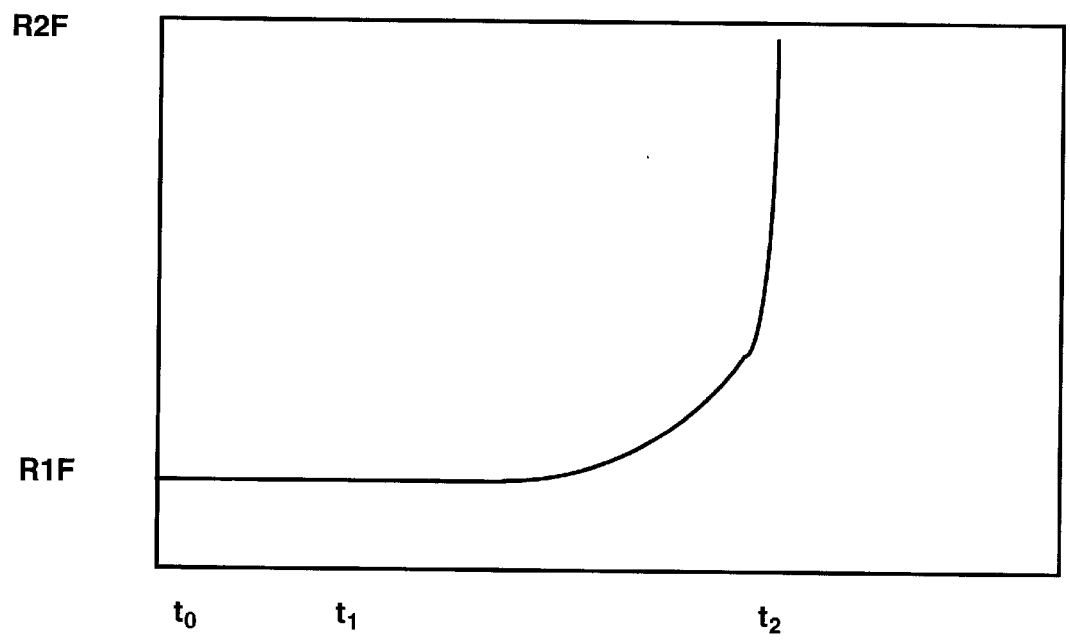
FIG. 5B illustrates a resistance characteristic of an exemplary fuse according to an aspect of the present invention.

FIG. 5B illustrates a resistance characteristic of an exemplary fuse according to an aspect of the present invention. As shown, the fuse has an initial low resistance $R1_F$. The fuse maintains the low resistance until a critical current $I_C$ is initiated at time $t_1$. At this point, an $I^2R$ heating causes the resistance of the fuse to increase, leading to thermal runaway; i.e. the increase in resistance leads to additional $I^2R$ heating, which leads to further increase in resistance, and so on. Eventually the $I^2R$ heating causes the fuse to melt and become an open circuit $R2_F$ at time $t_2$. Thus, the memory cell with a fuse exhibits two states. The first, or initial, state is resistance $R1_F$, which can be controlled to a specified value through the choice of fuse materials and geometry. The second, or final state, is $R2_F$, an open-circuit.

Programming a memory cell made of a fuse and anti-fuse combination is done by either applying the voltage $V_C$, leading to critical current $I_C$, if the second state is desired or leaving the cell alone if the first state is desired. The first and second states may be detected by applying a read voltage $V_R$ and detecting a presence or absence of an electrical current. Current presence indicates that the memory cell is in the first state and current absence indicates the second state.

Figure 5C:
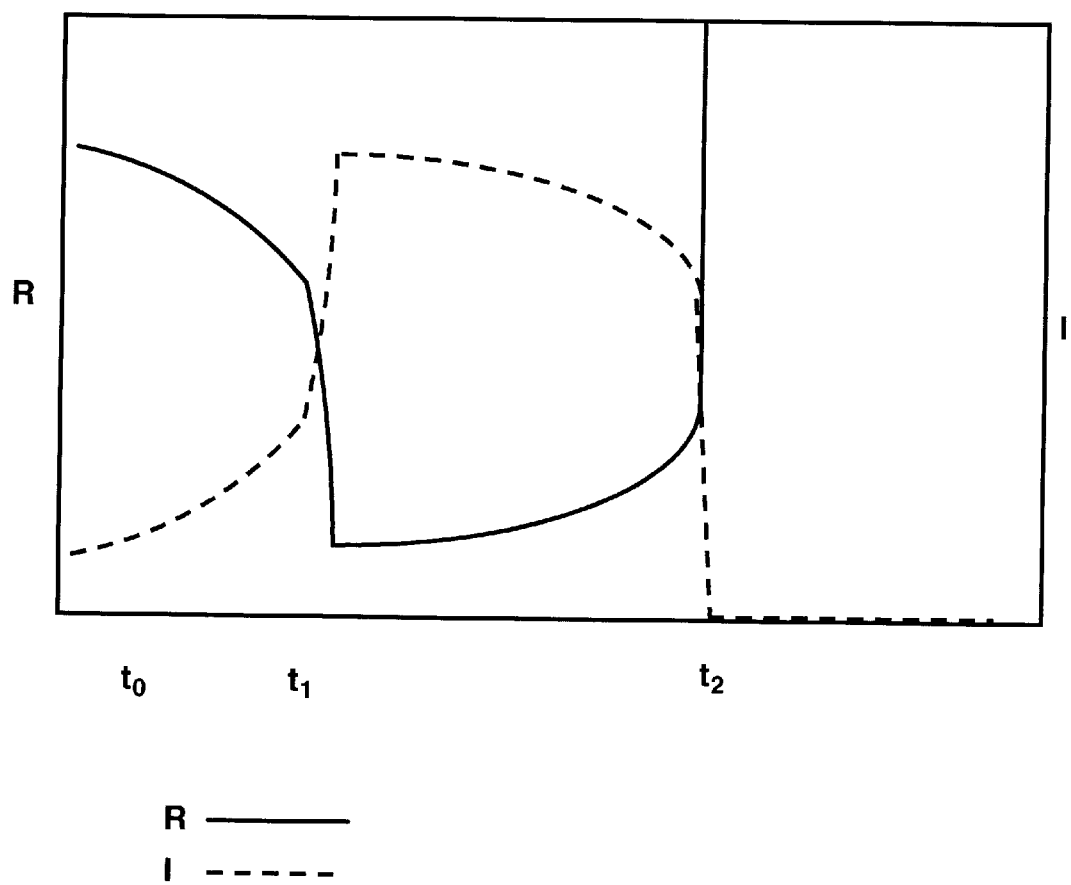
FIG. 5C illustrates the resistance and current characteristic of an exemplary fuse/anti-fuse series combination according to an aspect of the present invention.

As noted above, the memory cell generally includes a fuse and an anti-fuse connected in series. FIG. 5C illustrates a resistance (shown in solid line) and current (shown in dashed line) characteristics of an exemplary fuse/anti-fuse series combination according to an aspect of the present invention. Initially, the resistance of the combination is dominated by the high resistance $R1_{AF}$ of the anti-fuse. However, when sufficiently large voltage, i.e. $V_C$, is applied at time $t_0$, the anti-fuse breaks at time $t_1$ down as explained previously.

At this point, both the fuse and the anti-fuse are low in resistance as shown by the sharp drop in the resistance line around time $t_1$. Due to the low resistance, current passing through the fuse/anti-fuse combination becomes critical, i.e. critical current $I_C$ is generated. This melts the fuse as discussed previously.

The thermal runaway process causes the resistance of the combination to increase until finally the fuse breaks and becomes an open circuit at time $t_2$. At this point, the resistance of the combination is dominated by the open circuit $R2_F$. Correspondingly, the current becomes zero at time $t_2$ as shown by the dashed lines in FIG. 5C. The time between $t_0$ and $t_2$ may be extremely short, which allows rapid programming to take place.

Thus the memory cell with the fuse and anti-fuse in series exhibits two states. The first state, or the initial state, exhibits a finite resistance (generally dominated by $R1_{AF}$). In this first state, some amount of current may flow since the resistance is finite. The second state exhibits an infinite resistance (an open circuit $R2_F$). As a result, no current may flow across the cell (see the dashed line in FIG. 5C).

It should be noted that an anti-fuse is not strictly necessary for a memory cell. However, in a cross-point memory array that does not include a diode or transistor in series with the memory cell, the anti-fuse provides selectivity for programming a particular memory cell. Also the high initial resistance of the anti-fuse allows the individual resistance of the fuse to be reduced to an arbitrary value without jeopardizing the ability to sense an individual memory element in the array.

In addition, resistance of the anti-fuse can vary as different levels of voltage are applied to the memory cell. This characteristic can be used to enhance the memory cell selectivity function that an anti-fuse provides in memory devices.

Figure 1A:
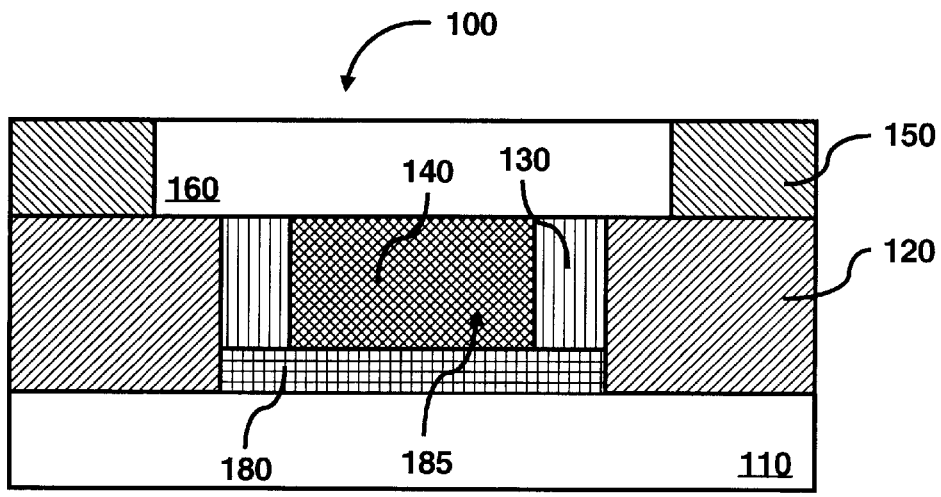
FIGS. 1A illustrates a cross-sectional view of a first embodiment of a memory cell according to the principles of the present invention.

FIG. 1A illustrates a cross-sectional view of a first embodiment of a memory cell 100 according to the principles of the present invention. As shown in FIG. 1A, the first embodiment of the memory cell 100 may include a bottom conductor 110 and a first insulator 120 situated above the bottom conductor 110. The first insulator 120 is formed around a perimeter of a closed region 185. As will be demonstrated below, the closed region 185 generally occupies a region defined by a cross-point of the memory.

To form the bottom conductor 110, conductive materials such as aluminum, copper, gold, tungsten, and the like and any alloys thereof can be used. Polysilicon may also be used to form the bottom conductor 110. To form the first insulator 120, materials such as silicon oxides and nitrides, aluminum oxides and nitrides, silicon oxynitrides, and the like can be used.

The memory cell 100 may also include an anti-fuse 180, which substantially occupies the closed region 185. As noted previously, the anti-fuse 180 can be formed from insulator materials, multilayer stacks of insulator materials separated by conductive materials, a matrix of insulating materials with conductive inclusions, amorphous and crystalline semiconductor materials, phase change materials, combinations of a multi-layer stack of Si and silicide-forming metals, etc. FIG. 1A shows that the anti-fuse is patterned as a thin wafer. However, this is not strictly necessary.

The memory cell 100 may further include a fuse 130 and an insulating plug 140. The fuse 130 and the insulating plug 140 may substantially occupy an edge and a center of the closed region 185, respectively, above the anti-fuse 180. Tops of the insulator 120, the fuse 130, and the insulating plug 140 may be coplanar.

To form the fuse 130, materials such as semiconductors (e.g. Si, Ge), conductors (e.g. Al, Cu, Ag, Au, Pt), low melting temperature materials (e.g. Zn, Sn, Pb, In), refractories (e.g. Ta, W), transition metals (Ni, Cr) and the like and any alloys thereof can be used. Also, the materials used to form the first insulator 120 can generally be used to form the insulating plug 140, although in certain embodiments it may be desirable for the insulating plug 140 to be etched away leaving a void.

Note that the insulating plug 140 is not strictly necessary. The insulating plug 140 helps to control the cross-sectional area of the fuse 130 in a plane parallel to the substrate plane, for example the area of the fuse 130 contacting the anti-fuse 180. Presumably, it is possible that a memory cell can be fabricated with the appropriate amount of surface area such that the insulating plug 140 is not necessary.

The memory cell 100 may still further include a second insulator 150 and a top conductor 160, both situated above the first insulator 120, the fuse 130 and the insulating plug 140. The top conductor 160 may be formed from similar materials used to form the bottom conductor 110 and the second insulator 150 may be formed from similar materials used to form the first insulator 120 and the insulating plug 140.

FIG. 1A also shows that an inner wall of the fuse 130 is bounded by the insulating plug 140 and an outer wall is bounded by the first insulator 120. This configuration provides for lateral thermal isolation of the fuse 130 and enables more efficient heating of the fuse 130 by application of current. However, it is not strictly necessary that the bounds of the walls of the fuse be strictly determined by the insulating plug 140 and the first insulator 120.

Also while not strictly necessary, the fuse 130 may be vertically oriented, i.e. the direction of current flow within the fuse 130 is substantially vertical. This allows the memory cells to be inserted between adjacent conductors. In particular, the cells can be placed at an intersection of a cross-point array of conductors to form a cross-point OTP memory array. Planes of these arrays can be stacked on top of one another, which increases the density dramatically. The vertical height of the fuse 130 may be equal to or greater than the width of the fuse 130, and in some cases substantially greater.

Further, while FIG. 1A shows that the top conductor 160 covers the entirety of the fuse 130 at the top of the closed region 185, this is not a requirement to practice the present invention. Similarly, FIG. 1A also shows that the bottom conductor 110 covers the entirety of the anti-fuse 180 at the bottom of the closed region 185. While complete coverage is shown, it is required only that a conductive path between the top and the bottom conductors 160 and 110 exists.

Thus, electrical connections should exist among the bottom conductor 110, the fuse 130, the anti-fuse 180, and the top conductor 160. It is not necessary that the bottom conductor 110, the fuse 130, the anti-fuse 180, and the top conductor 160 be in physical contact with each other.

Figure 1B:
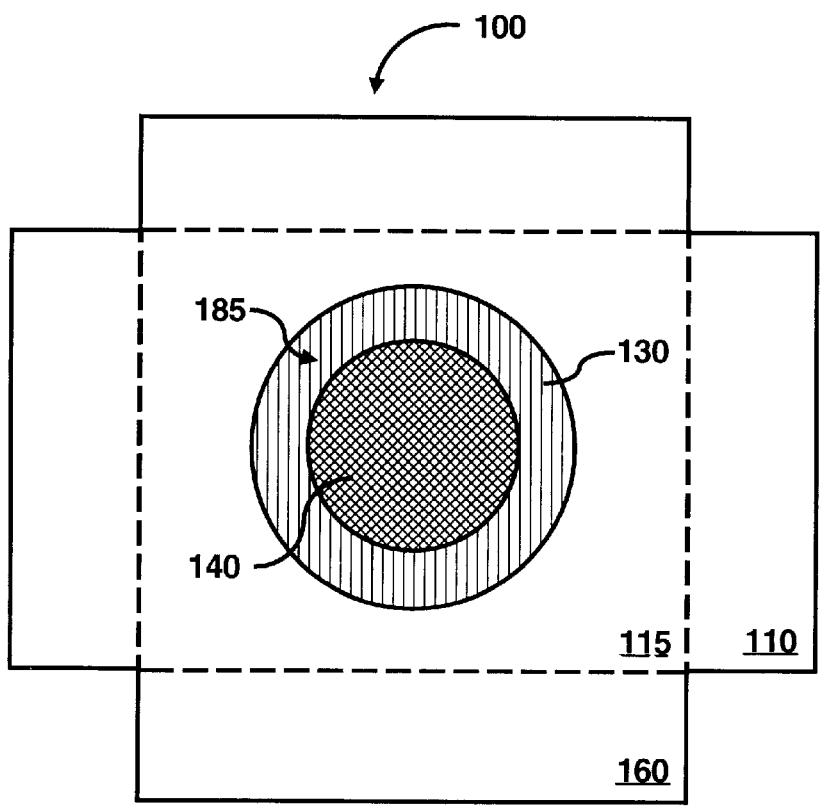
FIG. 1B illustrates a top view the first embodiment of FIG. 1A showing the cross-point nature of the memory cell.

FIG. 1B illustrates a top view of the first embodiment of FIG. 1A showing the fuse 130 and the insulating plug 140 substantially occupying the edge and center of the closed region 185, which is located within the cross-point 115 of the top and bottom conductors 160 and 110. The anti-fuse 180 (not shown in FIG. 1B) can have the same shape as the insulating plug 140 and fuse 130, or it can extend beyond the fuse 130 and assume a different shape. The top and bottom conductors 160 and 10 extend in their respective directions to form the cross-point 115 (shown as a dashed line region for illustrative purposes). Even though the closed region 185 is shown to be entirely located within the cross-point 115, this is not strictly required. As noted above, it is only necessary that electrical connectivity is maintained between the top and bottom conductors 160 and 110 through the structure within the closed region 185.

For simplicity, the first and second insulators 120 and 150 are not included in FIG. 1B. Also, for illustrative purposes, the fuse 130 and the insulating plug 140 are shown at the cross-point. However, the top conductor 160 may cover the entirety of the fuse 130 and the insulating plug 140. Also, even though a cross-point 115 is shown in FIG. 1B, it is only necessary that a region of overlap is created between the top and bottom conductors 160 and 110, i.e. the first and second directions need not be different.

Also, in FIG. 1B, the closed region 185 is shown as being cylindrical with the fuse 130 substantially occupying an annulus of the closed region 185 and the insulating plug 140 substantially occupying a center of the closed region 185. However, the shape of the closed region 185 is not so limited and may include other shapes as well, such as a rectangle, a square, an ellipse, or any other enclosed shapes. Again, the insulating plug 140 may only partially fill the interior of the closed region 185.

Figure 1C:
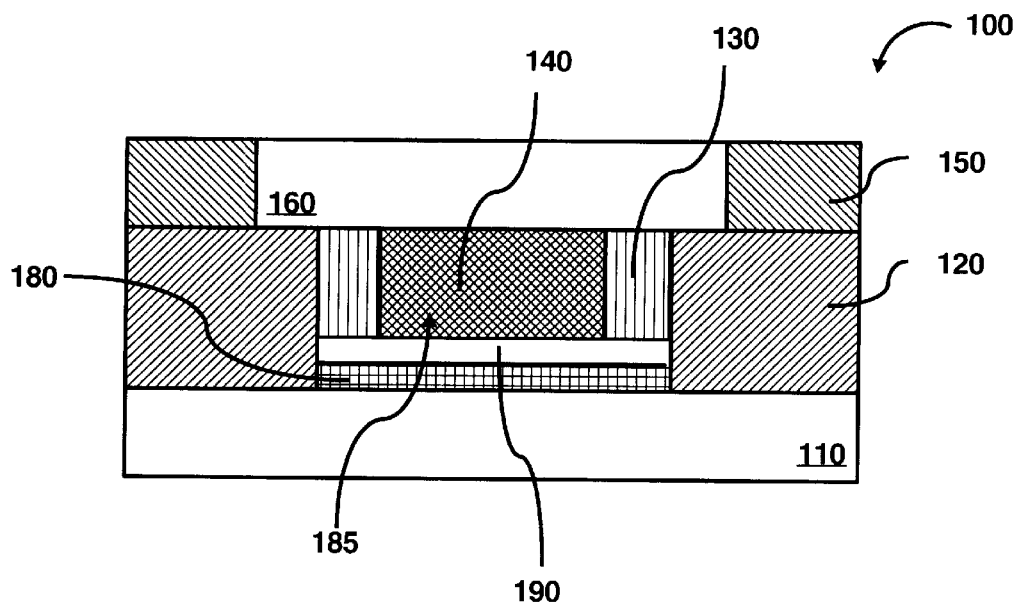
FIGS. 1C–1D illustrate variations on the first embodiment of FIGS. 1A.
Figure 1D:
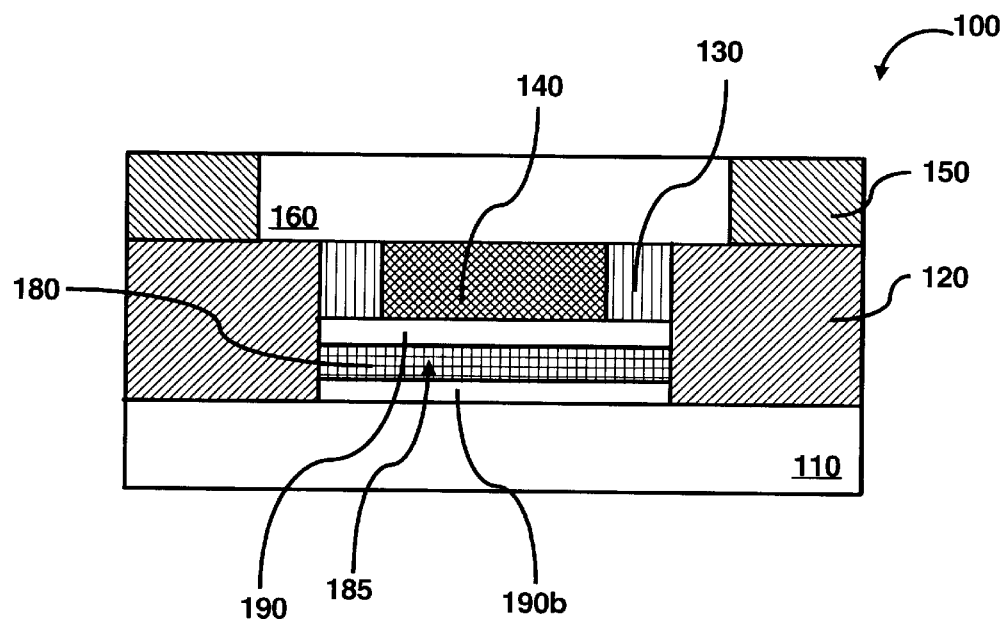

FIGS. 1C–1D illustrate variations on the first embodiment of FIG. 1A. In FIG. 1C, a thin conductor 190 may be placed as shown to enhance the performance of the memory cell. In FIG. 1D, two thin conductors 190 and 190b may be placed as shown for the same purpose. The thin conductors 190 and/or 190b enable independent control of the material adjacent to the anti-fuse 180 and provide a larger contact area between the fuse 130 and the anti-fuse 180. The thin conductors may be formed of aluminum, copper, nickel, titanium, tungsten, gold, metal nitrides, doped silicon, tantalum, and the like and the alloys thereof.

In FIG. 1C, the thin conductor 190 is placed between the anti-fuse 180 and the fuse 130 in the closed region 185. If only a single thin conductor is to be included, this is the preferred placement in order to increase the area of the top surface of the anti-fuse 180. In FIG. 1D, the first thin conductor 190 is placed between the anti-fuse 180 and the fuse 130 as in FIG. 1C, but also includes a second thin conductor 190b placed between the bottom conductor 110 and the anti-fuse 180.

One reason to include thin conductors 190 and/or 190b is to introduce a material with lower thermal conductive than present in the top or bottom conductors 160 or 110. A layer with low thermal conductivity may help to thermally isolate the memory cell from the top or bottom conductors 160, 110. Thermal isolation provides for more efficient use of heat generated by $I^2R$ processes.

Using an amorphous or crystalline semiconductors as the anti-fuse introduces additional reasons to include thin conductors 190 and/or 190b. First, the choice of conductor material in contact with the semiconductor determines whether a rectifying or ohmic contact is formed. The nature of this contact may affect the function of the anti-fuse 180. Second, in certain semiconductor anti-fuses, the low resistance state is created by metal migration through the semiconductor layer. This process is dependent on the metal adjacent to the semiconductor. Thin conductors 190 and/or 190b provide flexibility in the choice of conductors 110 and 160 and the metal layer adjacent to the semiconductor or anti-fuse.

As mentioned previously, some, or all, of the insulating plug 140 may be etched away leaving a void in the region of the insulating plug 140. This configuration provides extremely low thermal conductivity adjacent to the fuse 130, and provides space for molten or evaporated fuse material to enter. These features lower the power necessary to break the fuse 130.

Figure 2A:
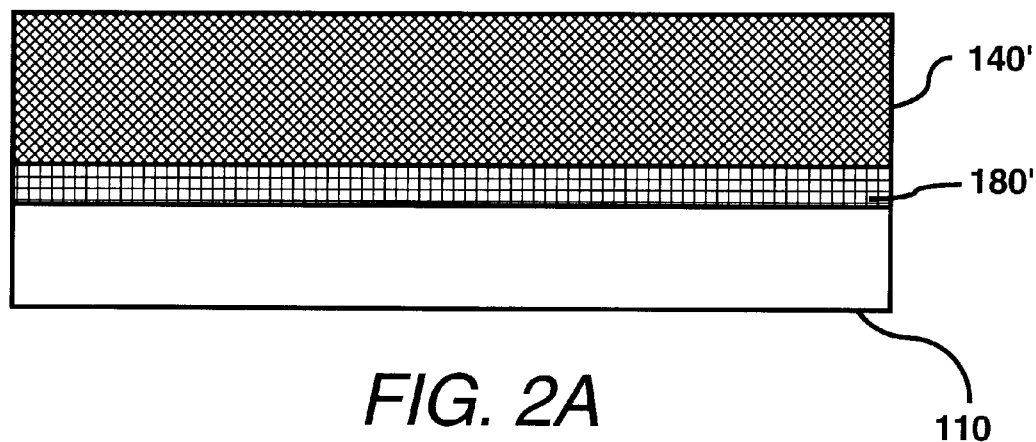
FIGS. 2A–2G illustrate cross-sectional views of an exemplary embodiment of a method of fabricating the first embodiment of the memory cell.

FIGS. 2A–2G illustrate cross-sectional views of an exemplary embodiment of a method of fabricating the first embodiment of the memory cell of FIG. 1A. As shown in FIG. 2A, a conductive material may be deposited and patterned to form the bottom conductor 110. Then an anti-fuse material 180' may be deposited above the bottom conductor 110 as shown. As part of the patterning process, the bottom conductor 110 may be planarized, by using well-known methods such as chemical-mechanical polishing ("CMP") prior to depositing the anti-fuse material 180'. Similarly, the anti-fuse material 180' may be planarized as well.

Figure 2B:
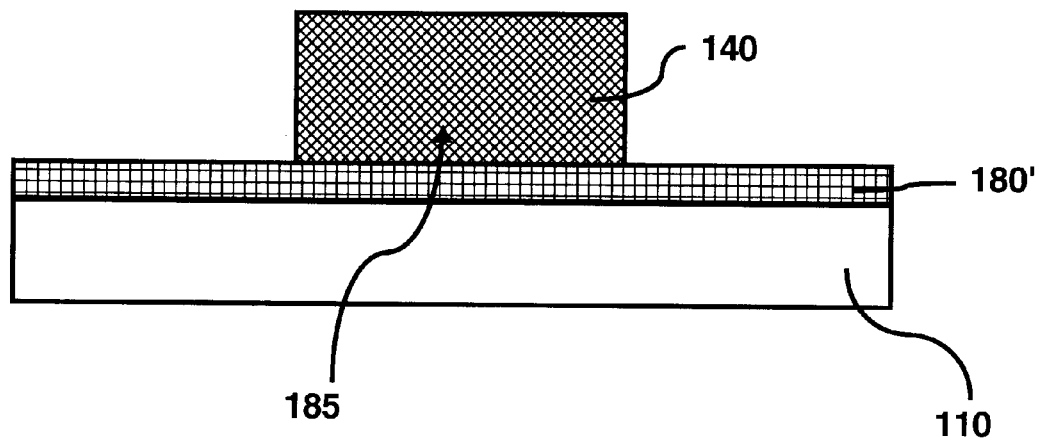

Subsequently, a dielectric film 140' may be deposited over the anti-fuse material 180'. Then, as shown in FIG. 2B, the dielectric film 140' may be etched to form the insulating plug 140. Standard lithography and etch methods may be used to form the insulating plug 140.

Figures 2, 2A:
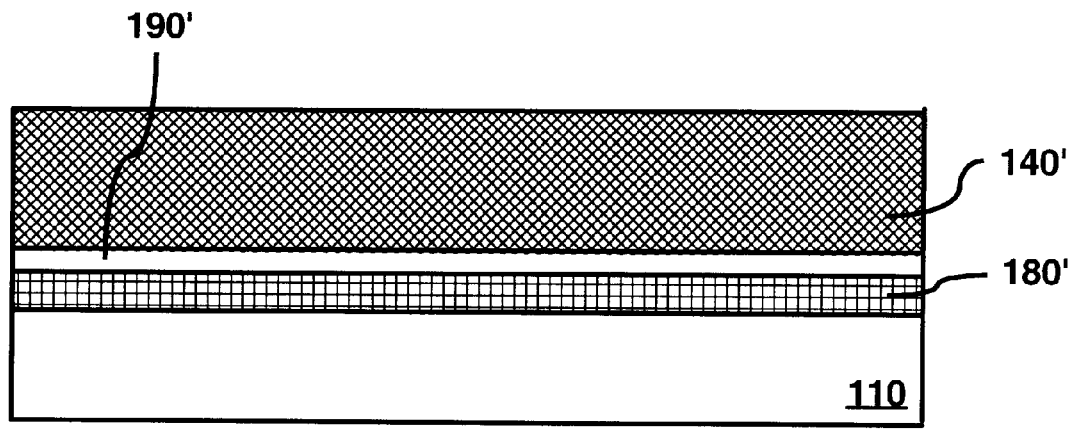
Figures 2, 2D:
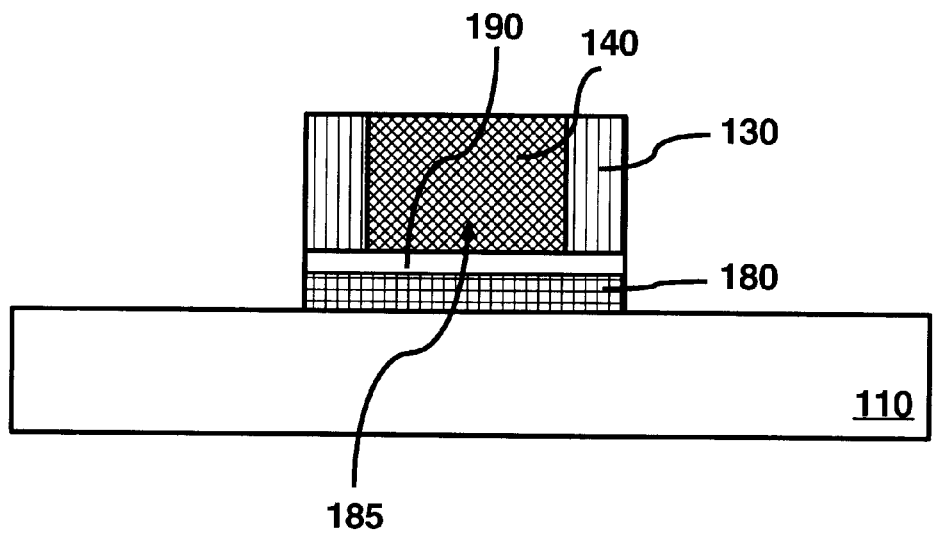
Figures 2, 2A, 3:
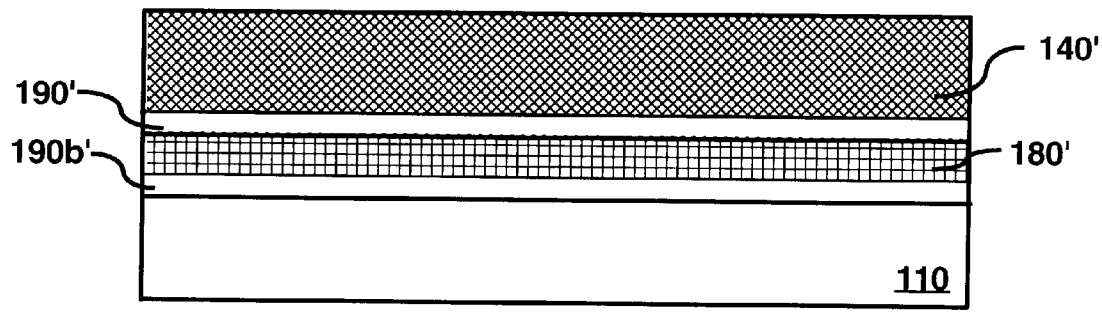
Figures 2, 2D, 3:
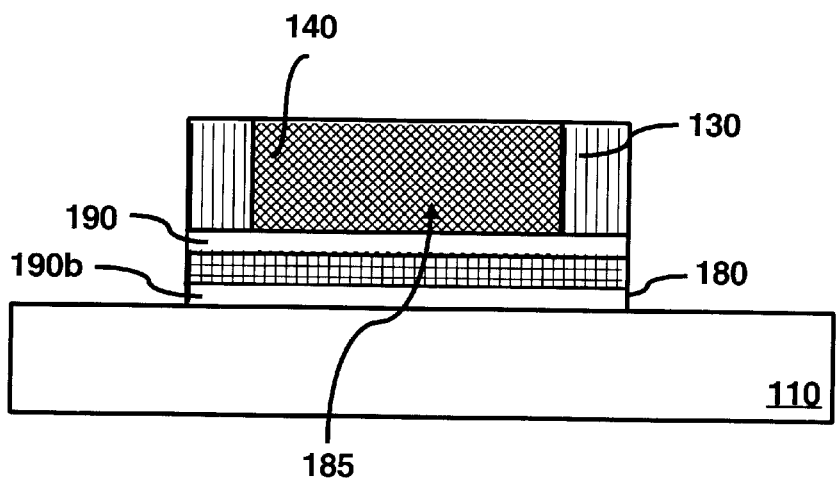
Figure 2C:
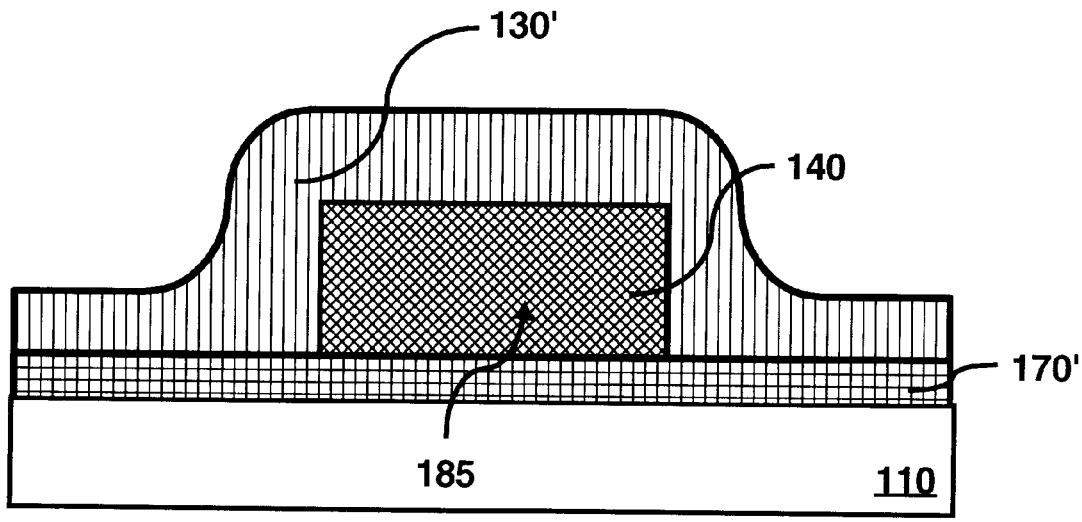
Figure 2D:
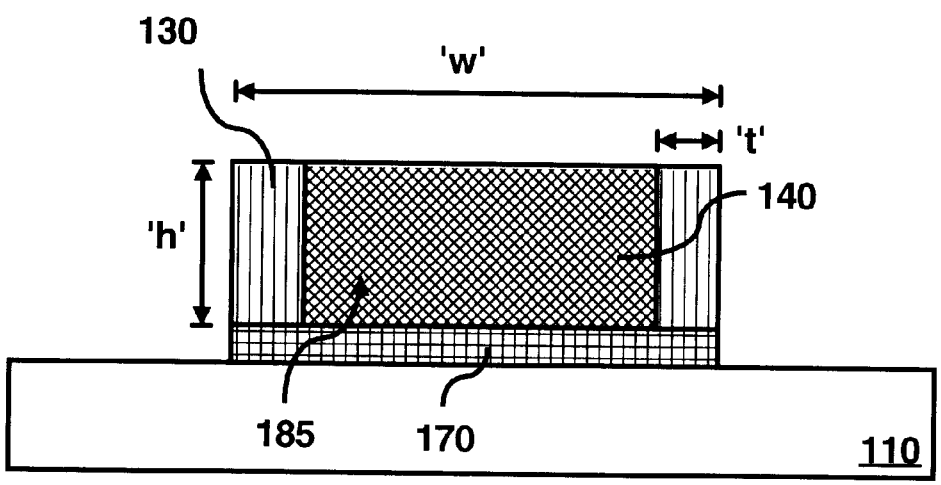

Then, as shown in FIG. 2C, a fuse material 130' may be deposited over the anti-fuse material 180' and even over the insulating plug 140. A deposition method such as atomic layer deposition (ALD) may be used to ensure a conformal coating and precise control of the thickness of the fuse material 130'. Afterwards, the fuse material 130' may be etched to leave the fuse 130 primarily on the wall of the insulating plug 140 as shown in FIG. 2D. This process is very well suited to fabricate the fuse 130 that is vertically oriented. The fuse 130 may be formed by anisotropic etching of the fuse material 130' using ion etching, reactive ion etching, or other etching methods.

Note that the fuse 130, in this case a vertically oriented fuse, is generally formed within the closed region 185. Also note that the etching process may etch the anti-fuse material 180' leaving an anti-fuse 180 so that the bottom conductor 110 is exposed in areas perimeter to the closed region 185. In the particular instance of an insulator anti-fuse, it is not necessary to pattern the anti-fuse material 180' since there is no conductivity in the plane of the film. Note further that the ratio of the vertical height 'h' of the vertically oriented fuse 130 to the width 'w' of the closed region 185 can be large such as 5 to 1 or more. When anisotropic etching is used, the process inherently leaves behind the fuse 130 primarily on the vertical sidewalls of the insulating plug 140. Thus lateral area consumption is kept to a minimum, which allows for precise control of the lateral thickness 't' of the fuse 130. Note that the vertical height 'h' to lateral thickness 't' ratio of the fuse 130 can be extremely large, such as 30 to 1 or more. Also, since the fuse 130 is only on the perimeter of the closed region 185, whereas the anti-fuse 180 covers at least the entire base of the closed region 185, the ratio of a anti-fuse area to fuse area can also be substantial.

Figure 2E:
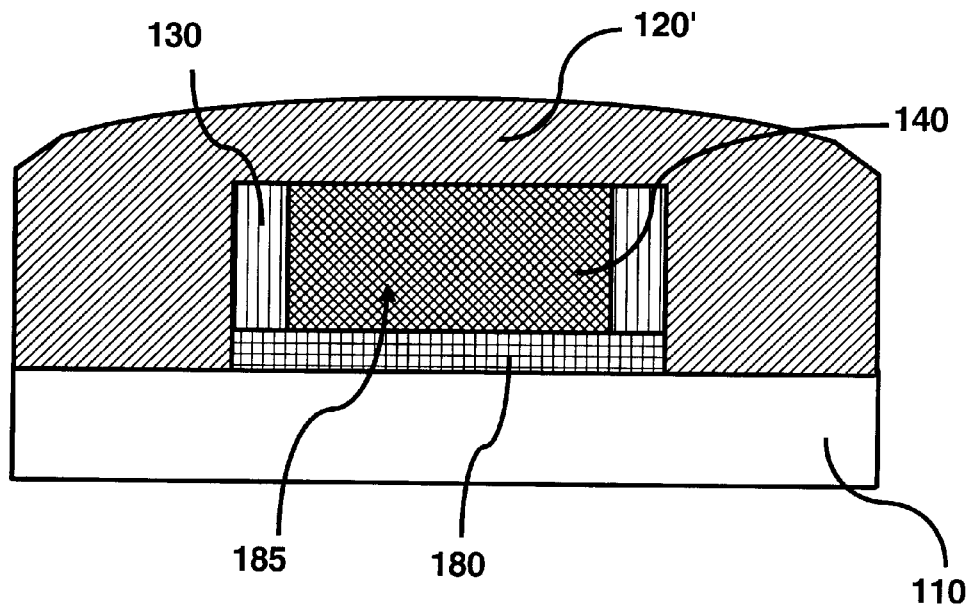
Figure 2F:
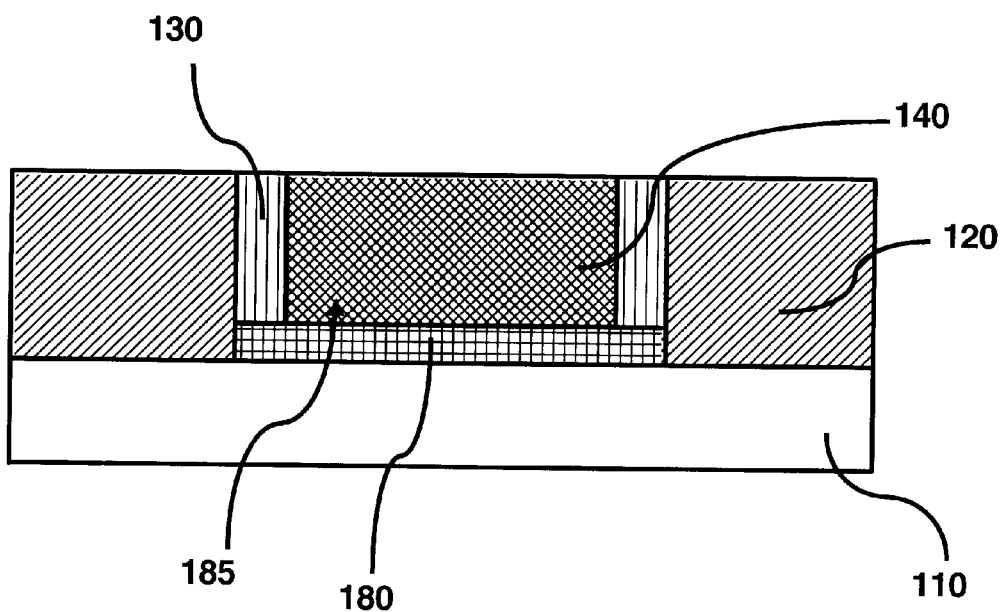

Then as shown in FIG. 2E, an insulating material 120' may be deposited over the bottom conductor 110 covering the area outside the perimeter of the closed region 185. Then the insulating material 120' is patterned to form the first insulator 120 as shown in FIG. 2F. The first insulator 120 may be patterned by planarizing the insulating material 120' to expose the fuse 130 and the insulating plug 140, again using CMP and/or other planarizing method(s). Indeed, the tops of the first insulator 120, fuse 130, and insulating plug 140 may define a plane. At this point the vertically oriented fuse 130 is bounded on all vertical sides by insulator. This configuration reduces heat transfer from the fuse to its surroundings.

Figure 2G:
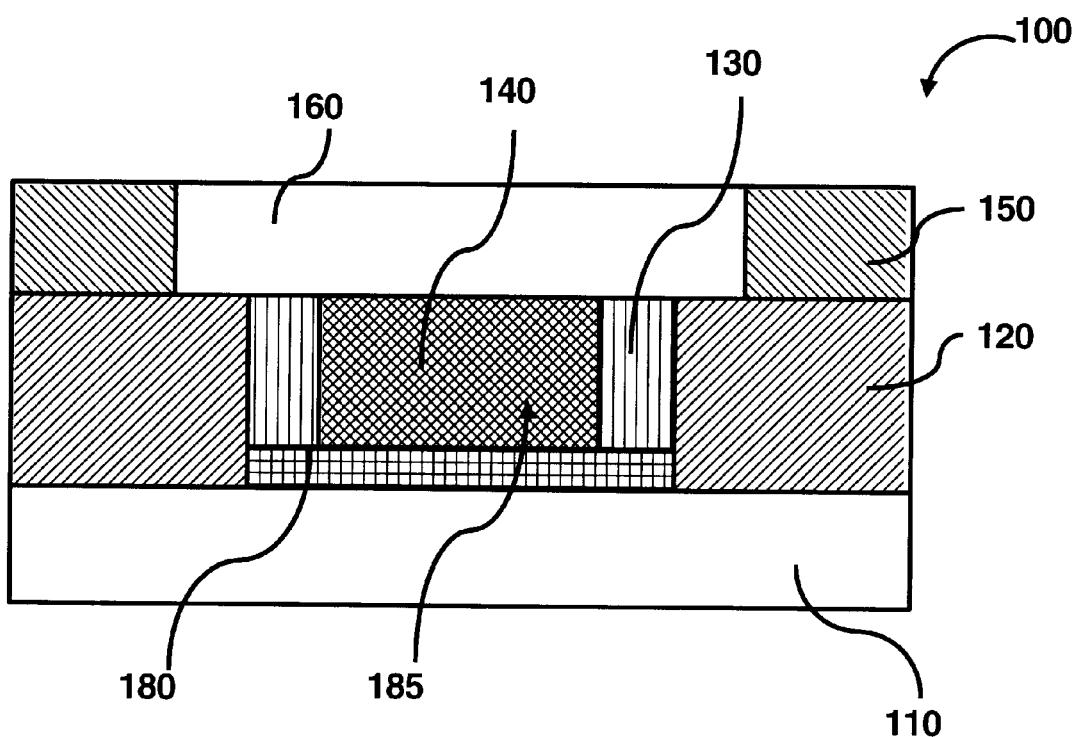

Then to complete the process, a top conductor 160 may be deposited and patterned in the first direction over the fuse 130, the insulating plug 140 and the first insulator 120. If desired, the second insulator 150 may be deposited over the top conductor 160 and first insulator 120 and planarized using CMP or other planarizing methods. The resulting structure is shown in FIG. 2G (same as FIG. 1A).

If a void is desired in the region of the insulating plug 140, then the insulating material can be removed by either wet or dry etching after definition of the top conductor 160. Access to the insulating plug 140 may be possible when the top conductor 160 does not completely cover the insulating plug 140. In other words, to generate a void region, the top conductor 160 and insulating plug 140 may be misaligned with respect to one another such that a portion of the insulating plug 140 is exposed for etching. After creating the void, the second insulator 150 can be deposited and patterned to complete the memory cell.

The steps indicated by FIGS. 2A–2G may be modified to fabricate the variations as shown in FIGS. 1C–1D. For example, to fabricate the thin conductor 190 between the anti-fuse 180 and the fuse 130 as shown in FIG. 1C, the fabrication steps illustrated in FIG. 2A may be replaced by FIG. 2A-2. As shown in FIG. 2A-2, a thin conductor material may be deposited and patterned above the anti-fuse material 180'. The dielectric material 140' may be deposited on top of the thin conductor material 190' afterwards. The fabrication then may proceed as described above and in FIGS. 2B–2G. Note that when the etching takes place to form the fuse 130, the thin conductor 190 and the anti-fuse 180 are etched to expose the bottom conductor 110 as shown in FIG. 2D-2.

To fabricate the first and second thin conductors 190 and 190b as shown in FIG. 1D, the fabrication steps illustrated in FIG. 2A may be replaced by FIG. 2A-3. As shown, a thin conductor material may be deposited above the bottom conductor 110 to form a second thin conductor material 190b', and then the anti-fuse 180 may be formed as described above. And then another thin conductor material may be deposited to form a first thin conductor material 190'. The dielectric material 140' may be deposited on top of the first thin conductor material 190' subsequently. The fabrication may proceed as described above and in FIGS. 2B–2G. Note that when the etching takes place to form the fuse 130, the first and second thin conductors 190 and 190b, respectively, and the anti-fuse 180 are etched to expose the bottom conductor 110 as shown in FIG. 2D-3.

While not shown, other variations are possible in addition to the variations shown in FIGS. 1C and 1D. For example, more thin conductors or other placements of the thin conductors may take place to augment the performances of the fuse 130 and/or the anti-fuse 180.

Figure 3A:
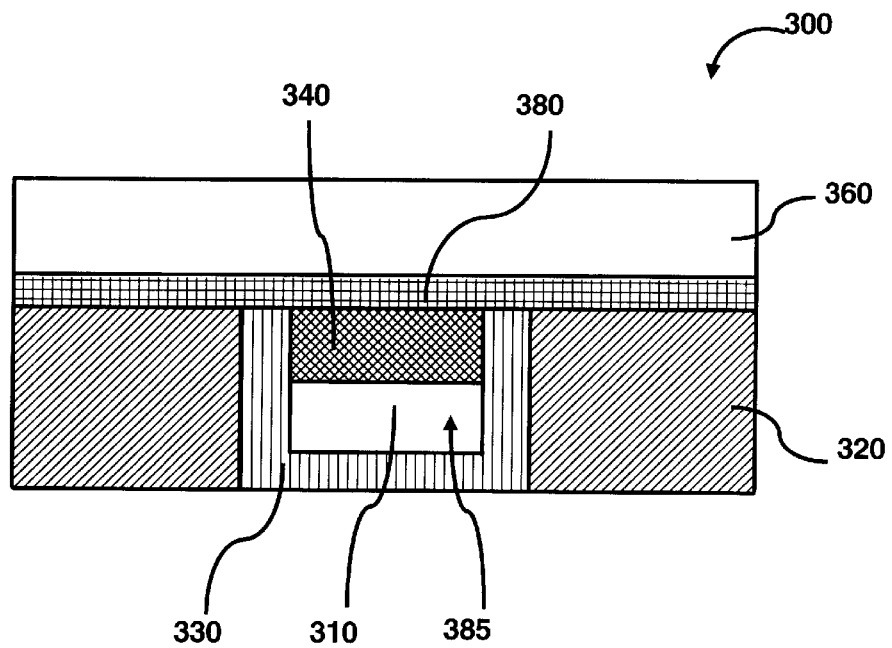
FIG. 3A illustrates a cross sectional view of a second embodiment of a memory cell according to the principles of the present invention.

FIG. 3A illustrates a cross-sectional view of a second embodiment of a memory cell 300 according to an aspect of the present invention. As shown, the memory cell 300 may include a fuse 330 and an insulator 320 formed on either side of the fuse 330. As will be seen later, the interior of the fuse 330 may or may not be completely filled.

The cell 300 may also include a bottom conductor 310. Note that vertical portions of the use 330 and the bottom conductor 310 make up a 'U' region 385. This 'U' region concept is better illustrated in FIG. 3D where the two vertical portions of the fuse 330 and the bottom conductor 310 make up the 'U' region 385, i.e. there is no horizontal portion to the fuse 330. The horizontal portion of the fuse 330 of FIG. 3A is not necessary to practice the invention.

The cell 300 may further include an insulating plug 340 occupying some or substantially all of the interior of the 'U' region 385. The cell 300 may still further include an anti-fuse 380 and a top conductor 360 above the above the 'U' region 385 and the insulator 320. Note that the fuse 330 and the insulating plug 340 may define a plane.

Materials used to form the various parts of the memory cell have been discussed above, and thus will not be repeated. Again, for reasons discussed before, the insulating plug 340 is not strictly necessary. Further, when the insulating plug 340 is present, top surfaces of the insulator 320, fuse 330, and the insulating plug 340 may be coplanar.

Figure 3B:
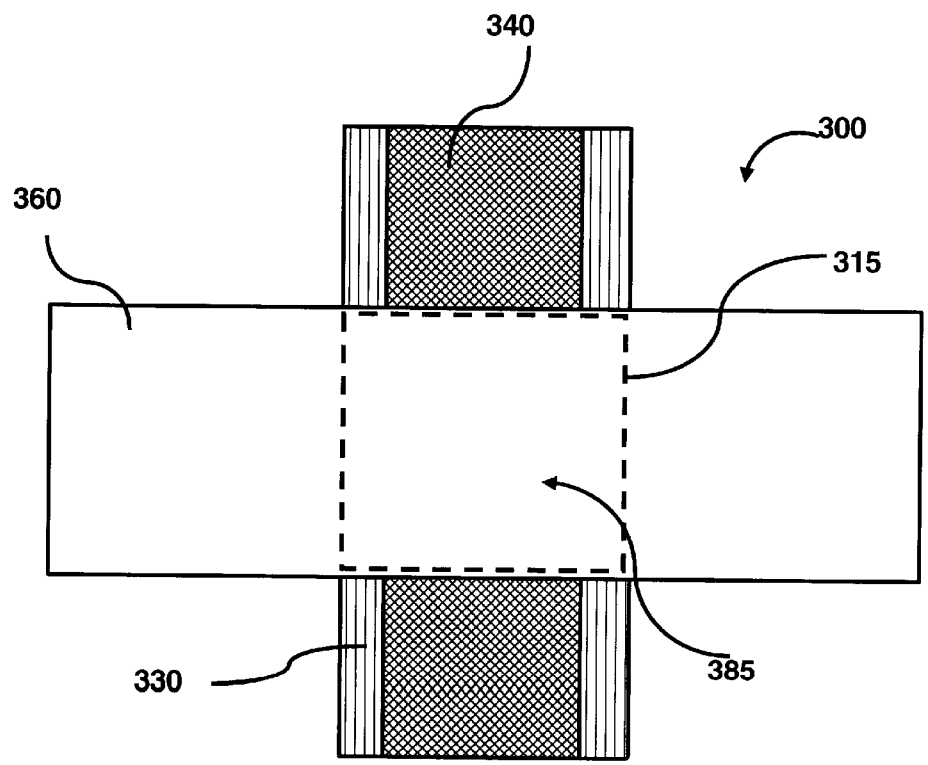
FIG. 3B illustrates a top view the second embodiment of FIG. 3A showing the cross-point nature of the memory cell.

FIG. 3B illustrates a top view of the second embodiment of FIG. 3A. As shown, the top conductor 360 may extend in a first direction. Note that the anti-fuse 380 (not visible in FIG. 3B) may also extend in the first direction. The anti-fuse 380 may also extend in a second direction on top of the fuse 330 and insulating plug 340. Indeed, if the anti-fuse material 380' is an insulator, the anti-fuse 380 does not require patterning since it is by definition insulating in the plane of the film. The fuse 330, and thus the 'U' region 385, including the insulating plug 340 and the bottom conductor 310 (not shown in FIG. 3B) may extend in the second direction and thereby defining a cross-point at the intersection.

Figure 3C:
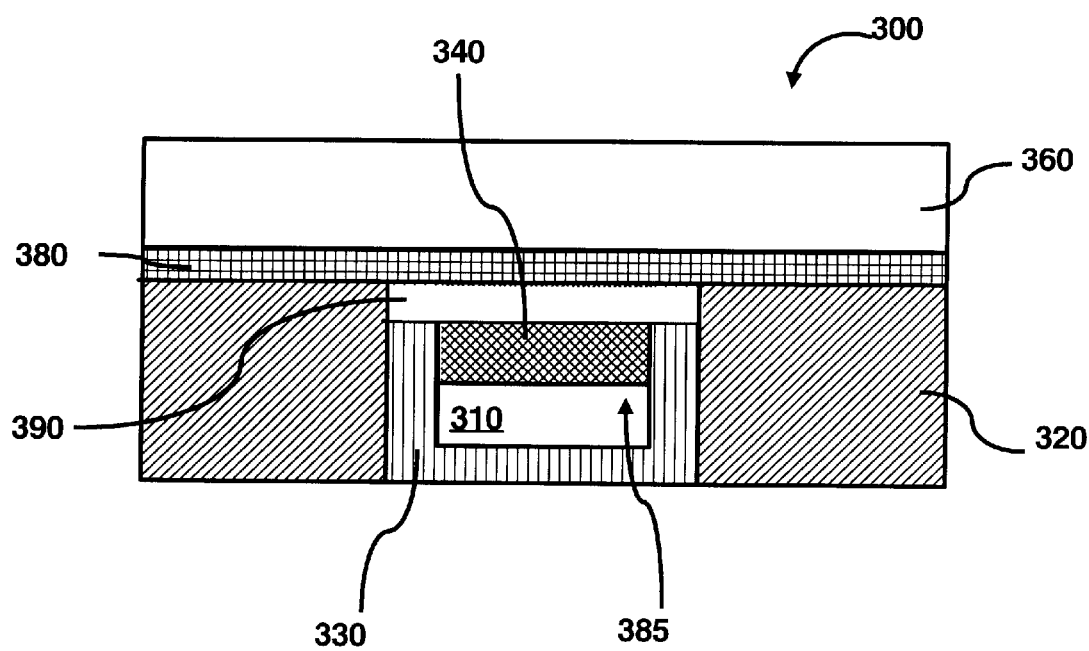
FIGS. 3C–3E illustrate variations on the first embodiment of FIG. 3A.
Figure 3D:
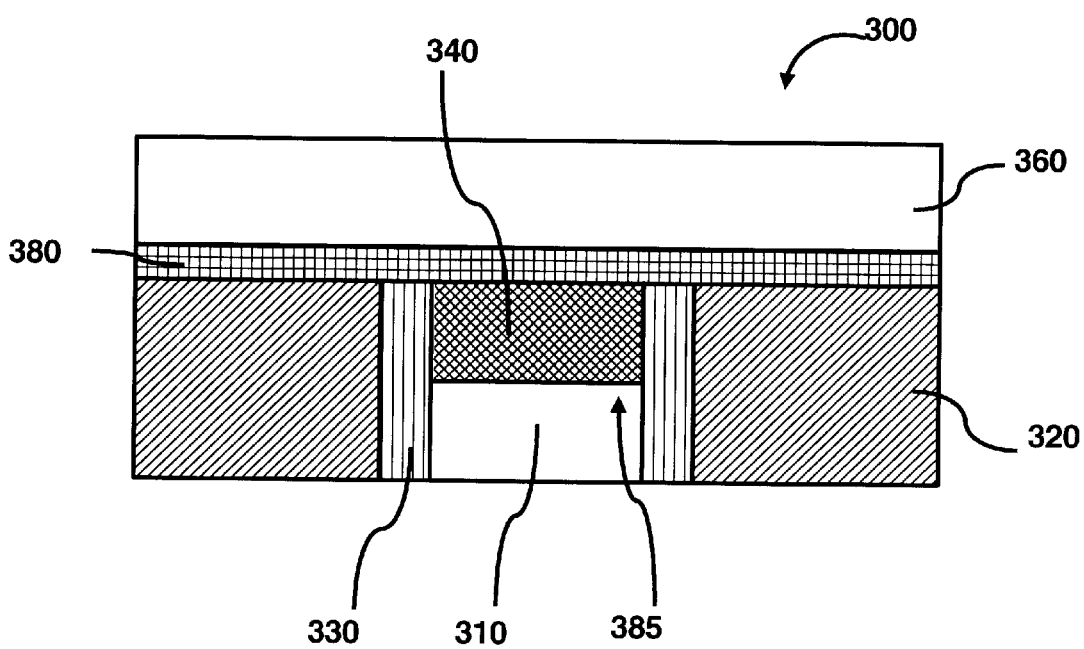
Figure 3E:
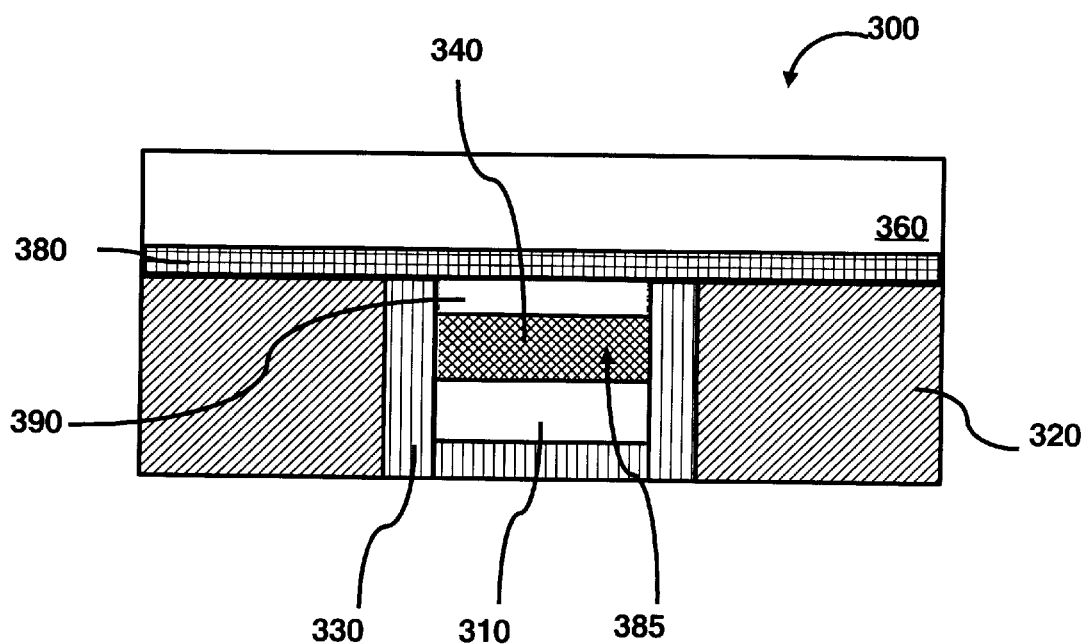

FIGS. 3C–3E illustrate variations on the second embodiment of FIG. 3A. In FIG. 3C, a thin conductor 390 may be placed between the fuse 330 and the anti-fuse 380 to enhance performance of the memory cell 300 as discussed previously with respect to the variations on the first embodiment. Note that the placement of the thin conductor 390 may be varied and is not limited to the placement as shown in FIG. 3C.

Again, instead of extending in the first direction like the top conductor 360, the thin conductor 390 may occupy a part of the 'U' region 385 above fuse 330 and below the top conductor 360. In other words, the thin conductor 390 may be substantially limited to an area defined by a cross-point 315.

FIG. 3D, in addition to clarifying the 'U' region 385, also illustrates a variation of the on the second embodiment of FIG. 3A. As noted above, the horizontal portion of the fuse 330 is not necessary to practice the invention. FIG. 3D demonstrates this concept.

Further in FIG. 3E, the thin conductor 390 need not cover the entirety of the 'U' region 385. In this variation, the thin conductor 390 is formed substantially within the interior of the 'U' region 385 and the fuse 330 is in contact with the anti-fuse 380. Note that many other variations are possible and are within the scope of the invention.

While the foregoing descriptions of the memory cell associated FIGS. 3A–3E indicate that the fuse 330, insulating plug 340, and 'U' region 385 extend in a second direction along with the bottom conductor 310, this orientation is not required to practice the present invention. Indeed, the fuse 330 can be associated with the top conductor 360 and extend in a first direction. In this case the vertical portions of the fuse 330 and the top conductor 360 now make up an inverted 'U' region 385. An insulating plug 340 can once again occupy some or substantially all of the inverted 'U' region 385. The memory cell 300 may still further include an anti-fuse 380 substantially occupying the bottom of the inverted 'U' region 385 above bottom conductor 310.

Figure 4A:
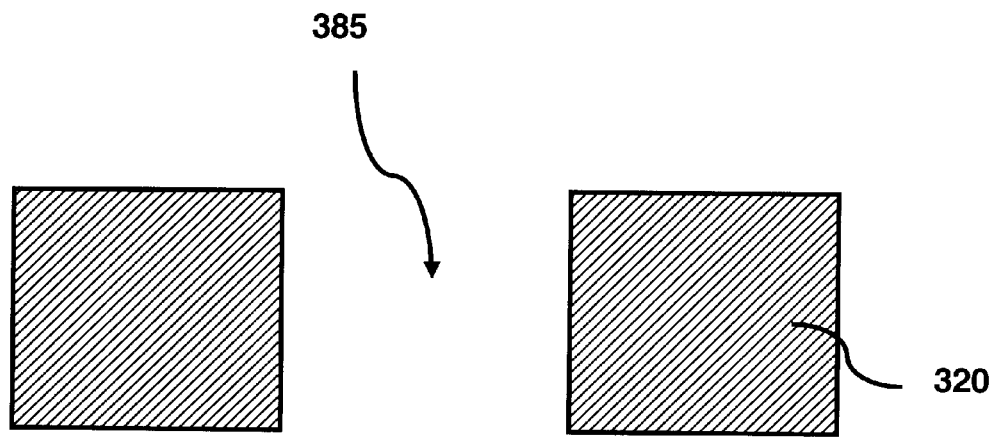
FIGS. 4A–4G illustrate cross-sectional views of an exemplary embodiment of a method of fabricating the second embodiment of the memory cell.

FIGS. 4A–4G illustrate cross-sectional views of an exemplary embodiment of a method of fabricating the second embodiment of the memory cell 300 of FIG. 3A. As shown in FIG. 4A, an insulator material may be deposited and patterned to form the insulator 320. The insulator 320 may be patterned to define a trench where the 'U' region 385 will be formed. Again, the height to width ratio of the closed region 385 can be large (5 to 1 or more).

Figure 4B:
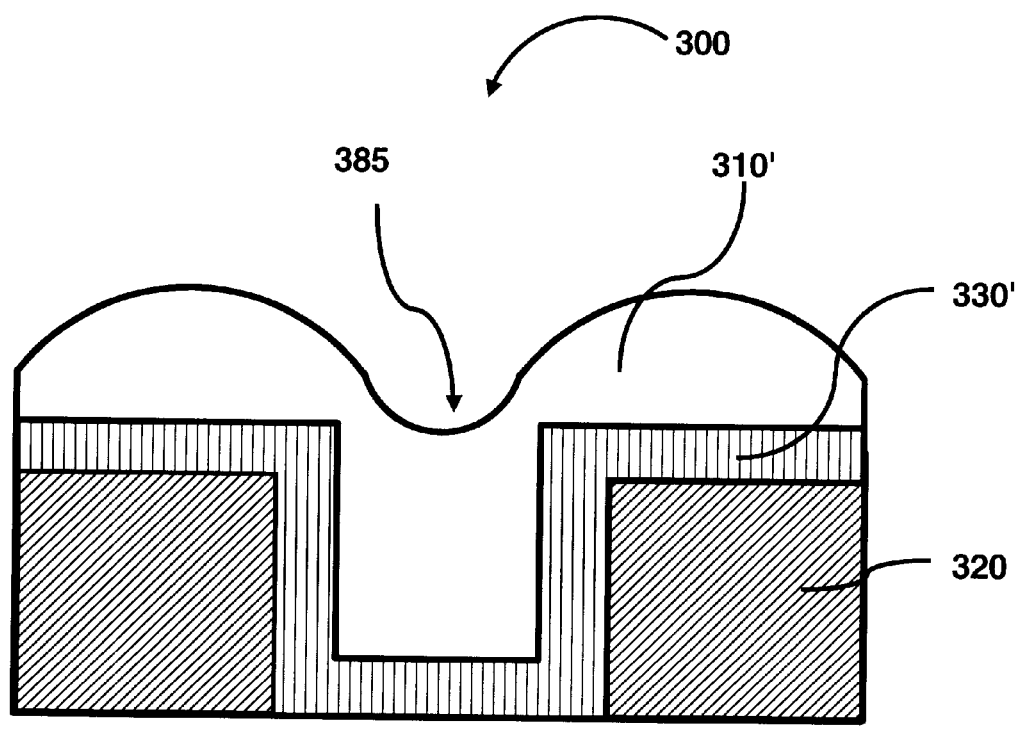

Then, as shown in FIG. 4B, a fuse material 330' may be deposited into the trench and even over the insulator 320. The deposition naturally creates the 'U' shape of the fuse 330. Conformal coating of the first insulator 320, including vertical walls, may be achieved using deposition methods as ALD and the like. Then a conductor material 310' is deposited over the fuse material 330' including into the 'U' region 385.

Figure 4C:
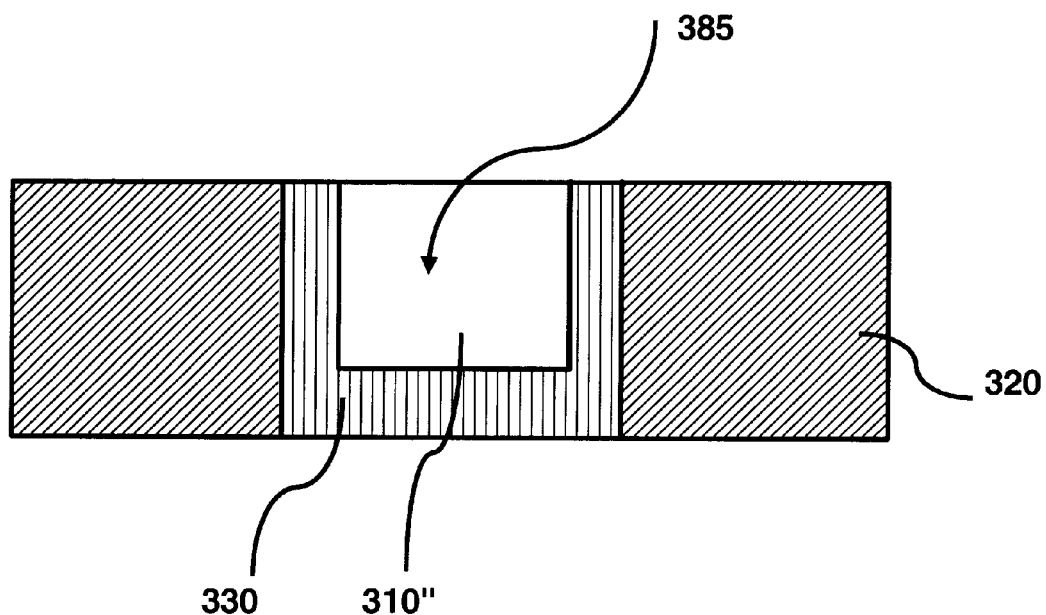

Then as shown in FIG. 4C, the fuse material 330' and the conductor material 310' may be planarized using standard methods such as the CMP. At this point, the insulator 320, the bottom conductor 310, and the fuse 330 may be coplanar.

Figure 4D:
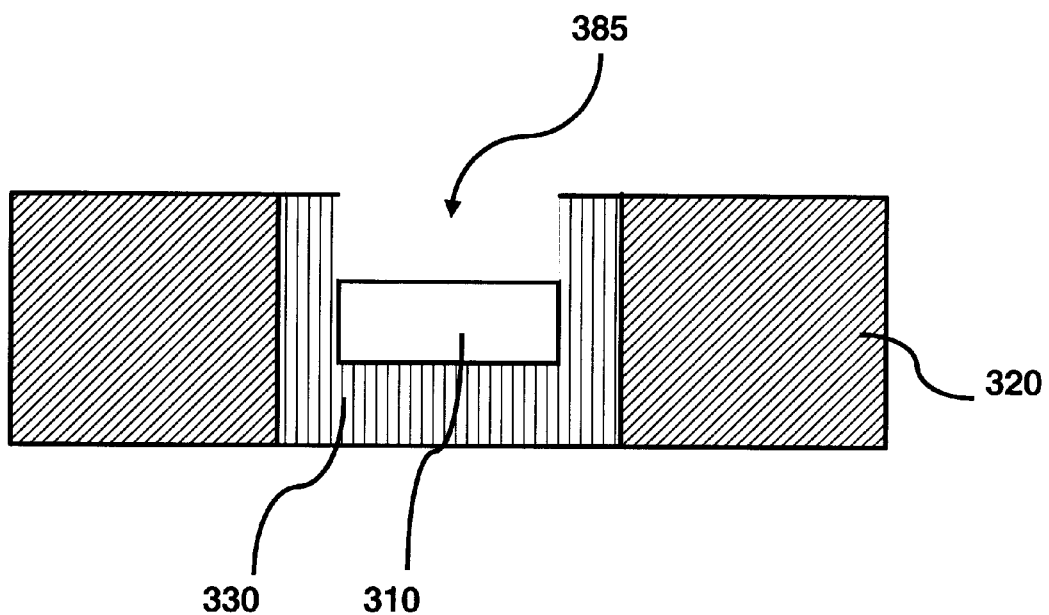

Then, as shown in FIG. 4D, the bottom conductor 310 may be preferentially etched using etching techniques such as wet etching, reactive ion etching, ion milling, and the like to a prescribed depth so that the bottom conductor 310 forms a lateral portion of the 'U' region 385.

Figure 4E:
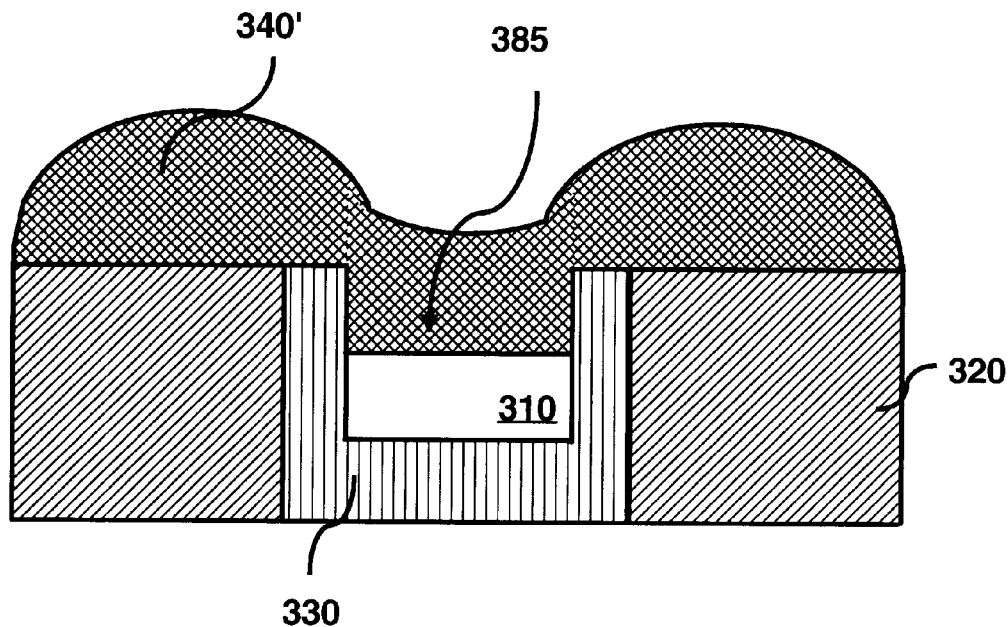
Figure 4F:
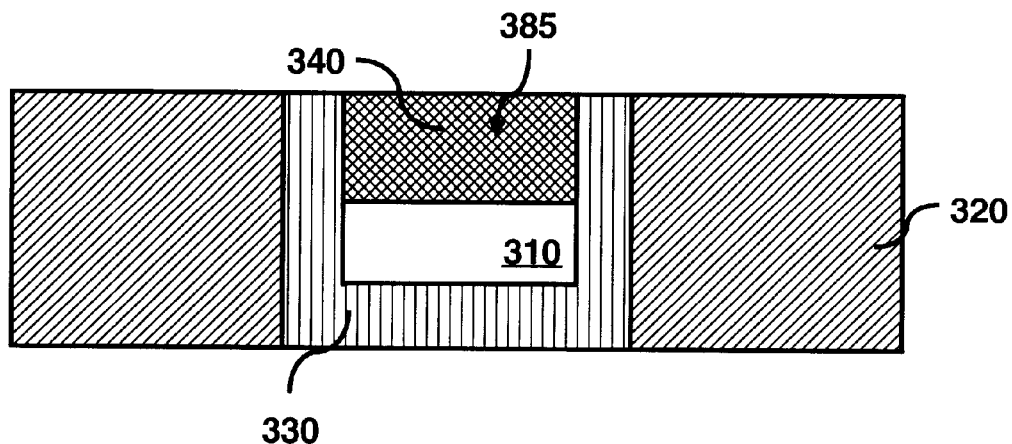

Then, as shown in FIG. 4E, an insulating plug material 340' may be deposited to fill the interior of the 'U' region 385, and the resulting surface may be planarized. At this point, the insulating plug 340, the insulator 320, and the fuse 330 may be coplanar as shown in FIG. 4F.

Figure 4G:
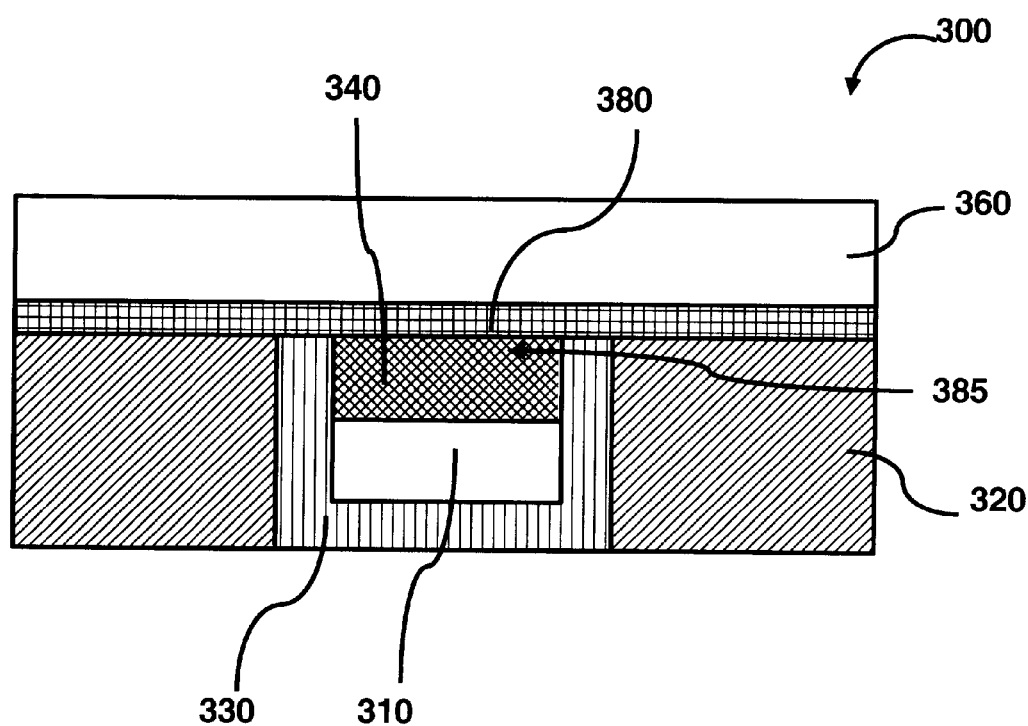

Then, to complete the process, an anti-fuse material and another conductor material may be deposited and patterned to form the anti-fuse 380 and the top conductor 360 as shown in FIG. 4G (same as FIG. 3A). Note that prior to depositing the conductor 360, the anti-fuse 380 may be planarized. Also, planarizing the top conductor 360 may be part of the fabrication process.

The steps indicated by FIGS. 4A–4G may be modified to fabricate the variations as shown in FIGS. 3C–3E by one of ordinary skill. And again, a void may be created similar to as discussed with reference to the first embodiment.

While the invention has been described with reference to the exemplary embodiments thereof, those skilled in the art will be able to make various modifications to the described embodiments of the invention without departing from the true spirit and scope of the invention. The terms and descriptions used herein are set forth by way of illustration only and are not meant as limitations. In particular, although the method of the present invention has been described by examples, the steps of the method may be performed in a different order than illustrated or simultaneously. Those skilled in the art will recognize that these and other variations are possible within the spirit and scope of the invention as defined in the following claims and their equivalents.

What is claimed is:

1. A memory cell, comprising:
    a top conductor extending in a first direction;
    a bottom conductor extending in a second direction so as to define a region of overlap between said top and bottom conductors, said bottom conductor having electrical connectivity with said top conductor;
    a fuse formed in said region of overlap having electrical connectivity with said top and bottom conductors, wherein a programmable portion of said fuse lies substantially within said region of overlap; and
    an anti-fuse formed in electrical series with said fuse.

2. The memory cell of claim 1, wherein:
    said fuse is shaped such that a void exists in said fuse substantially about a center of said fuse.

3. The memory cell of claim 1, wherein said fuse substantially occupies a closed region near said region of overlap, said memory cell further comprising:
    an insulating plug substantially occupying a center of said closed region such that an inner wall of said fuse is bounded by said insulating plug; and
    an insulator formed around a perimeter of said closed region such that an outer wall of said fuse is bounded by said insulator.

4. The memory cell of claim 1, wherein said fuse is a vertically oriented fuse.

5. The memory cell of claim 4, wherein a vertical height to a lateral thickness ratio of said vertically oriented fuse is unity or greater.

6. The memory cell of claim 1, wherein said fuse extends in one of said first and second directions.

7. The memory cell of claim 6, wherein said anti-fuse extends in the other of said first and second directions.

8. The memory cell of claim 6, further comprising:
    an insulator formed at an exterior region of said fuse; and
    an insulating plug formed at an interior region of said fuse.

9. The memory cell of claim 1, wherein said fuse substantially occupies a closed region near said region of overlap, said memory cell further comprising:
    a thin conductor formed in said closed region between said fuse and anti-fuse.

10. The memory cell of claim 9, wherein thin conductor is a first thin conductor, said memory cell further comprising:
    a second thin conductor formed in said closed region between said anti-fuse and one of said bottom conductor and said top conductor.

11. The memory cell of claim 1, wherein said anti-fuse is at least one of an insulator material, a multilayer stack of insulator materials separated by conducting materials, a matrix of insulating material containing dispersed conductive inclusions, amorphous and crystalline semiconductor materials, phase change materials, combinations of a multi-layer stack of Si and silicide-forming metals, and wherein:
    said insulator material includes at least one of diamond-like carbon, $SiO_X$, $SiN_X$, $SiO_X N_Y$, $AlO_X$, $TaO_X$, $TiO_X$, $AlN_X$;
    said amorphous and crystalline semiconductor material includes at least one of Si, Ge, alloys of Si and Ge, GaAs;
    said phase change material includes at least two of Si, Ge, As, Se, In, Sn, Sb, Te, Pb, and Bi; and
    said silicide-forming metals include at least one of W, Pt, Pd, Co, Ni, and Ti.

12. The memory cell of claim 11, wherein said insulator material for said anti-fuse has a thickness substantially between 0.5 and 50 nm.

13. The memory cell of claim 11, wherein said amorphous and crystalline semiconductor material for said anti-fuse has a thickness substantially between 1 and 100 nm.

14. The memory cell of claim 1, wherein said fuse is made of at least one of Si, Ge, Al, Cu, Zn, Xn, Pb, Ag, Au, Pt, In, Ta, W, Ni, Cr, and any alloys thereof.

15. A method to form a memory cell, comprising:
    forming a top conductor extending in a first direction;
    forming a bottom conductor extending in a second direction so as to define a region of overlap at an intersection between said top and bottom conductors, said bottom conductor having electrical connectivity with said top conductor;

forming a fuse in said region -of overlap having electrical connectivity with said top and bottom conductors, wherein a programmable portion of said fuse lies substantially within said region of overlap; and forming an anti-fuse in electrical series with said fuse.

16. The method of claim 15, wherein said fuse substantially occupies a closed region near said region of overlap, said method further comprising:

forming an insulating plug substantially occupying a center of said closed region such that an inner wall of said fuse is bounded by said insulating plug; and forming an insulator on around a perimeter of said closed region such that an outer wall of said fuse is bounded by said insulator.

17. The method of claim 16, further comprising:

forming a thin conductor in said closed region between said fuse and anti-fuse.

18. The method of claim 17, wherein thin conductor is a first thin conductor, said method further comprising:

forming a second thin conductor in said closed region between said anti-fuse and one of said bottom conductor and said top conductor.

19. The method of claim 15, wherein said fuse extends in one of said first and second directions.

20. The method of claim 19, wherein said anti-fuse extends in the other of said first and second directions.

21. The method of claim 15, further comprising:

etching said insulating plug such that a void is created substantially about a center of said vertically oriented fuse.

22. The method of claim 15, wherein a vertical height to lateral thickness ratio of said fuse is unity or greater.

23. The memory cell of claim 1, wherein a resistance of said anti-fuse varies as voltage across said anti-fuse varies.

24. The memory cell of claim 23, wherein said resistance of said anti-fuse decreases as said voltage across said anti-fuse increases.

* * * * *